United States Patent

Mizugaki et al.

[11] Patent Number: 6,123,764
[45] Date of Patent: Sep. 26, 2000

[54] MANUFACTURING METHOD FOR CALCIUM FLUORIDE CRYSTAL AND PROCESSING METHOD FOR CALCIUM FLUORIDE POWDER

[75] Inventors: Tsutomu Mizugaki, Matsudo; Kazuo Kimura, Machida; Shuuichi Takano, Inagi, all of Japan

[73] Assignee: Nikon Corporation, Tokyo, Japan

[21] Appl. No.: 09/201,802

[22] Filed: Dec. 1, 1998

[30] Foreign Application Priority Data

Dec. 1, 1997 [JP] Japan ..................................... 9-330669

[51] Int. Cl.⁷ ..................................................... B30B 11/02
[52] U.S. Cl. .................. 117/68; 117/77; 117/78; 117/81; 117/82; 117/940
[58] Field of Search ................. 117/940, 68, 77, 117/78, 81, 82

[56] References Cited

U.S. PATENT DOCUMENTS

| | | | |
|---|---|---|---|
| 3,981,818 | 9/1976 | Swinehart et al. .................. | 252/300 |
| 4,030,965 | 6/1977 | Hammond et al. .................. | 117/940 |
| 4,076,574 | 2/1978 | Pastor et al. ....................... | 117/940 |
| 4,379,733 | 4/1983 | Pastor et al. ....................... | 117/940 |
| 5,864,386 | 1/1999 | Nei ...................................... | 355/30 |

FOREIGN PATENT DOCUMENTS 9-315893  12/1997  Japan .

OTHER PUBLICATIONS

Mouchovski et al, "Growth of ulta–violet grade CaF crystals and their application for excimer laser optics", Journal of Crystal Growth, vol. 162, 79–82, 1996.

*Primary Examiner*—Robert Kunemund
*Attorney, Agent, or Firm*—Morgan, Lewis & Bockius LLP

[57] ABSTRACT

A manufacturing method for a single crystal of calcium fluoride includes the steps of degassing calcium fluoride powder particles to desorb impurities from surfaces of the calcium fluoride powder particles, preprocessing the degassed calcium fluoride powder particles by fusing the degassed calcium fluoride powder particles in a crucible to obtain a preprocessed product, and re-fusing the preprocessed product in a crucible to grow a single crystal of calcium fluoride.

10 Claims, 2 Drawing Sheets

MANUFACTURING METHOD FOR CALCIUM FLUORIDE CRYSTAL AND PROCESSING METHOD FOR CALCIUM FLUORIDE POWDER

This application claims the benefit of Japanese Patent Application No. 09-330669 filed Dec. 1, 1997, which is hereby incorporated by reference.

BACKGROUND OF THE INVENTION

1. Field of the Invention

The present invention relates to a manufacturing method for a single crystal of calcium fluoride and a processing method for calcium fluoride powder.

2. Discussion of the Related Art

In the past, single crystals of calcium fluoride ($CaF_2$, or calcium fluoride) have been manufactured primarily using a Bridgeman method (sometimes called a Stockburger method or a crucible lowering method).

The material for making a single calcium fluoride crystal for use within the visible or infrared range has typically been manufactured using a mixture of a set amount of crushed natural calcium fluoride or synthetic calcium fluoride (manufactured by using natural calcium fluoride) and a scavenger. However, for the purpose of manufacturing (i.e., growing) a single calcium fluoride crystal for use in the ultraviolet or vacuum ultraviolet range, the above materials cannot be used because crushed natural calcium fluoride or synthetic calcium fluoride absorbs in the ultraviolet or vacuum ultraviolet. Therefore, a mixture of a high purity powder of a chemically synthesized calcium fluoride and a scavenger has been used. However, because there is a significant reduction in volume when the powder is directly fused due to its high specific gravity, a cullet, which is a lump of material obtained by fusing the high purity powder once, is crushed and the resultant material, is sometimes used as a starting material.

The starting material is filled in a growth crucible, placed in a growth furnace, and maintained in a vacuum. Then, the temperature inside the growth furnace is gradually increased and the material is fused; followed by lowering the growth crucible, such that the material crystallizes from the bottom of the crucible and a single calcium fluoride crystal is grown.

When a single calcium fluoride crystal is manufactured as above from a powdered calcium fluoride using the Bridgeman method, a lot of gas impurities are adsorbed on the surface of the powder particles, and there is a significant reduction in the degree of the vacuum due to the desorption of the adsorbed gas during the increase in temperature. Therefore, it is impossible to heat the powder continuously or to increase the temperature at a specific rate up to the maintenance temperature. Consequently, heating at low power and vacuum exhaustion must be conducted intermittently. As a result, the de-airing (degassing) process using a single crystal manufacturing furnace takes an extremely long time, resulting in reduced productivity and delays in the manufacturing process.

When the powder is melted and crystallized, the volume is reduced to approximately ⅓ of the powdered state. Therefore, in general, a preprocessed product, such as fused glass or a cullet, is used as the material and filled in a growth crucible, and then a single crystal of calcium fluoride is grown. However, the desorbed gas from the powdered material is mixed in with the preprocessed product, and as with the single crystal manufacturing furnace, productivity is reduced when using the preprocess furnace.

SUMMARY OF THE INVENTION

Accordingly, the present invention is directed to a manufacturing method for calcium fluoride crystals and a processing method for calcium fluoride powder that substantially obviates one or more of the problems due to the limitations and disadvantages of the related art.

An object of the present invention is to provide a processing method for a powdered material for a calcium fluoride crystal for obtaining a high purity single calcium fluoride crystal.

Another object of the present invention is to improve the efficiency of single calcium fluoride crystal manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a manufacturing method for a single crystal of calcium fluoride including the steps of degassing calcium fluoride powder particles to desorb impurities from surfaces of the calcium fluoride powder particles, preprocessing the degassed calcium fluoride powder particles by fusing the degassed calcium fluoride powder particles in a crucible to obtain a preprocessed product, and re-fusing the preprocessed product in a crucible to grow a single crystal of calcium fluoride.

In another aspect of the present invention there is provided a manufacturing method for a single crystal of calcium fluoride comprising the steps of, degassing calcium fluoride powder particles wherein adsorbed gas on surfaces of the calcium fluoride powder particles is desorbed by heating the powder in a crucible for a maintenance period in a vacuumed furnace, preprocessing the degassed calcium fluoride powder particles by conducting a deoxygenation reaction in a vacuumed furnace, the preprocessing step being conducted at a temperature that is approximately the melting point of calcium fluoride or higher to obtain a preprocessed product, crystallizing the resultant preprocessed product by filling the preprocessed product into a crucible, followed by fusing the preprocessed product at the melting point of calcium fluoride or higher, and lowering the crucible and thereby crystallizing the preprocessed product from a bottom of the crucible.

In another aspect of the present invention there is a processing method for a powdered calcium fluoride material comprising the steps of, filling a powdered calcium fluoride material in a crucible, and heating the material in a vacuumed furnace at a maintenance temperature for a maintenance period sufficient to desorb gas impurities from surfaces of powder particles of the powdered calcium fluoride material.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a schematic view of a de-airing (degassing) furnace; and

FIG. 2 a schematic view of multiple stacked crucibles used for the preprocess.

DETAILED DESCRIPTION OF THE PREFERRED EMBODIMENTS

Reference will now be made in detail to the preferred embodiments of the present invention, examples of which are illustrated in the accompanying drawings.

The present inventors assumed that during the manufacturing of a calcium fluoride powder, the adsorbed gas on the surface of the particles, which contain a large amount of impurities, is greatly desorbed when the temperature is increased during heating at an initial stage of the manufacturing process of a single calcium fluoride crystal or during the manufacturing of a preprocessed product. This not only causes a delay due to a significant reduction in the degree of vacuum, but the desorbed gases contaminate the inside of a single crystal manufacturing furnace or a preprocess furnace, and then remain as impurities. This adversely affects the internal quality of the single crystal that is the final product.

Figure 1:
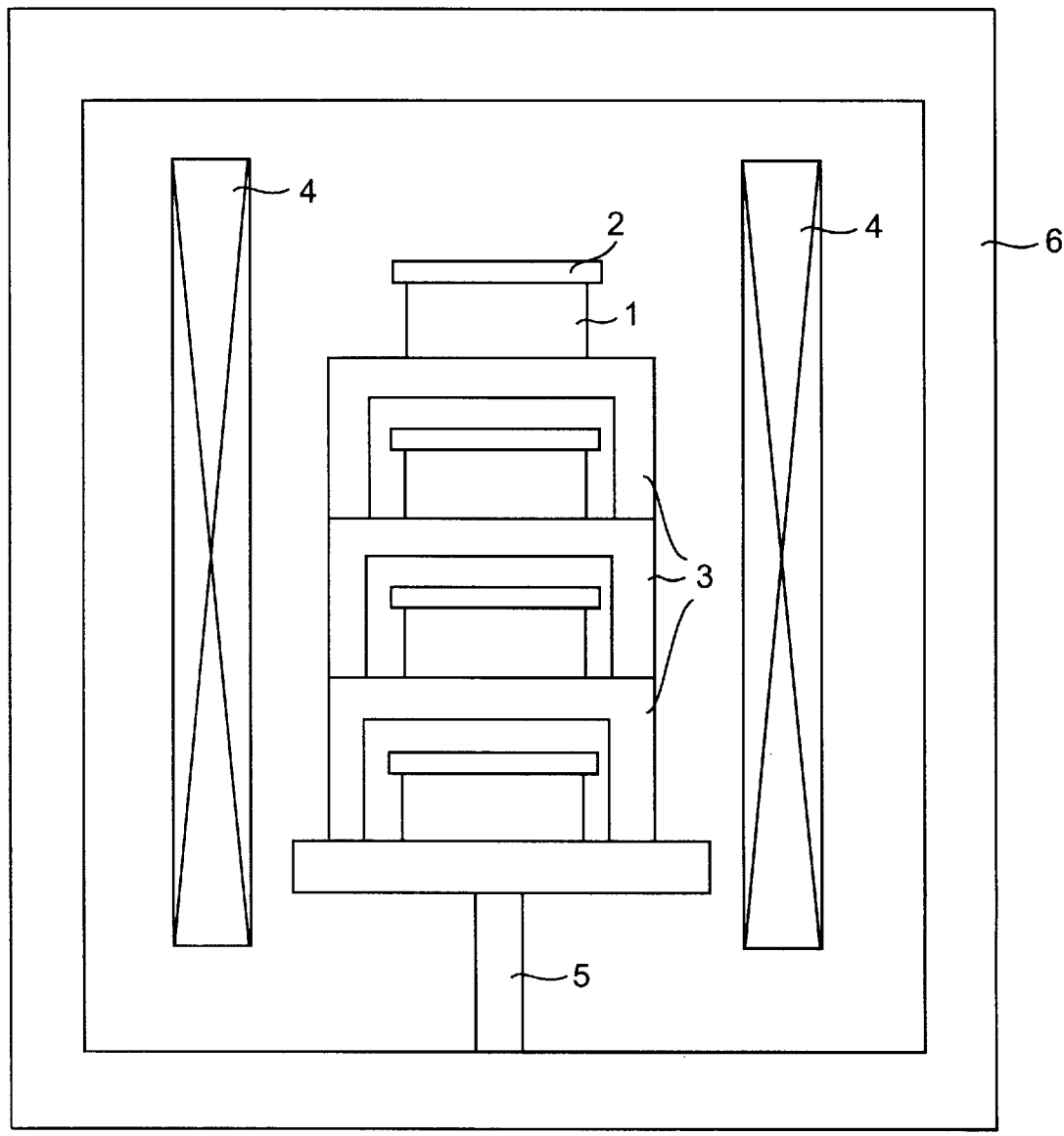

FIG. 1 shows an example of a furnace used in the present invention. Vertically aligned shelves 3 enable multiple crucibles 1 to be placed in the furnace. Thus, the number of crucibles processed per batch increases, and the time spent on the degassing process relative to the entire processing time of the single crystal manufacturing or the preprocess product manufacturing can be reduced. The number of shelves 3 may be selected based on the amount of the powder, the size of the crucibles and the total weight of the powder and the crucibles. Examples of the material used for the shelves are, as with the crucibles, graphite and boron nitride. Multiple graphite heaters 4 are arranged increased along a direction of a vertical axis, such that the isothermal length is maximized. The furnace also includes an insulation layer 6. A supporting platform (base plate) 5 is located underneath the shelves 3. A lid 2 is placed over a topmost crucible.

The present invention obtains a high-quality powdered material by conducting a de-airing (degassing) process such that the gas impurities adsorbed on the surface of the powder particles are desorbed in advance by heating the calcium fluoride material powder used in the manufacturing of the single crystal of calcium fluoride as a preprocess for either the manufacturing process of a single crystal or of a preprocess product. Thus, the contamination of the single crystal manufacturing furnace or preprocess furnace can be prevented, and impurity content reduced. In addition, by reducing a time it takes to reach the high vacuum state needed for the single crystal manufacturing process or the preprocess, it is possible to improve the productivity of both.

First, the degassing process of the present invention will be described. The degassing is conducted to obtain a high quality powdered material, to prevent contamination and to improve the productivity. A high purity calcium fluoride powdered material ("the material" or "the powder") or in the case of a fine powder, a mixture of calcium fluoride with a scavenger, are filled in a crucible for the degassing and placed in an electric furnace for the degassing (see FIG. 1, where an exhaust system is not shown). In order to have a deoxygenated atmosphere inside the furnace, it is brought to a vacuum of $10^{-3}$ to $10^{-5}$ Pa. Then, the furnace is continuously vacuum-exhausted while the temperature inside the furnace is gradually increased so as to maintain the high vacuum. When only a powdered material is used, the lower limit of the maintenance temperature is set to 700° C., at which temperature the carbon compounds on the surface decompose, and the upper limit of the maintenance temperature is set to a maximum of 1350° C., which is the melting point of calcium fluoride. In addition, when a powder mixture of calcium fluoride and a scavenger is used, the temperature is set as high as possible (to the extent that the material and the scavenger do not begin reacting with each other), and the adsorbed gas on the surface of the particles of the powder is desorbed. For example, when lead fluoride ($PbF_2$) is used as a scavenger, the upper temperature limit is 800° C. After the degassing is completed, the temperature inside the furnace is gradually lowered and a powder, with the adsorbed gas on the surface of the particles now desorbed, is obtained.

As described above, by utilizing the degassing it is possible to obtain a highly pure calcium fluoride powder. In addition, by degassing the powder in advance, it is possible to reduce the heating time at the initial stage of the manufacturing of the single crystal of calcium fluoride or the manufacturing of a preprocessed product. Consequently, the entire process of manufacturing the preprocessed product becomes less time-consuming. Furthermore, by degassing the powdered material with a dedicated processing furnace, it is possible to prevent the contamination of the single crystal manufacturing furnace or the preprocessing furnace. Moreover, productivity is improved because it is separated from the use of the single crystal manufacturing furnace or the preprocessing furnace.

Examples of scavengers are Teflon, lead fluoride, cobalt fluoride, and manganese fluoride. The maintenance temperature and maintenance period of the degassing process are set based on the particle size of the powder, the mass, the type of scavenger and the changes in the degree of vacuum. By taking chemical reactivity into account, the amount of scavenger should be 0.1 to 5.0 mol % relative to the calcium fluoride material.

In addition, by using a lid formed of a porous material with a porosity of 20 to 60%, it is possible to effectively exhaust the desorbed gas from the powder in the crucible, and to reduce the degassing time.

The degassing crucible and the lid can be formed of any material that does not react with calcium fluoride and that has a low wetability. In the present embodiment, graphite is used, however, boron nitride can also be used.

Next, the preprocess of the present invention will be described.

The preprocess not only increases the filling rate of the growth crucibles, but also highly purifies the material and improves the internal quality of the single calcium fluoride crystal. A high purity calcium fluoride powder and a scavenger are mixed and filled in the preprocess crucible, which is placed in an electric furnace for preprocessing. The mixture is fused by creating a deoxygenated atmosphere inside the electric furnace. In order to remove oxides and volatile impurities (which are products of the reaction), the furnace maintains a vacuum of $10^{-3}$ to $10^{-5}$ Pa. The temperature of the furnace is gradually increased to +100° C. above the temperature at which the powder and scavenger react, in other words, above the decomposition temperature of the scavenger. When lead fluoride ($PbF_2$) is used, for example, the furnace is maintained at 800° C. to 900° C. initially, and the temperature is further increased to the melting point of the powder or greater, that is, to between 1370° C. to 1450° C. At this temperature, the excess scavenger and products of the reaction are vaporized and the powder is fused. Then, the fused product is solidified by gradually decreasing the temperature to produce the preprocessed product.

With the above-mentioned fusing method, it is possible to produce a highly pure preprocessed product. In addition, by using a dedicated preprocessing furnace for the preprocessing of the powder, it is possible to prevent the inside of the growth furnace from becoming contaminated by the products of the reaction generated during the preprocessing, and to handle the excess scavenger. Accordingly, there is no difficulty with the temperature control of the growth furnace, and it is possible to manufacture a highly pure single crystal of calcium fluoride. In addition, it is possible to separate the process from the growth furnace, and the growth furnace can be operated more efficiently.

In addition, by using multiple stacked crucibles for the preprocess, it is possible to efficiently obtain the preprocessed product. When multiple stacked crucibles are used under very airtight conditions, the removal of the product of the reaction generated at each stack cannot efficiently be carried out. Consequently, there is a reduction in the internal quality of the preprocessed product. In addition, due to heat conductivity of the stacks, the upper crucibles in the preprocessing furnace have a higher temperature, and lack fluorine atmosphere, while the lower crucibles have a large quantity of unreacted scavenger remaining. As a result, a high quality preprocessed product cannot be obtained.

The present inventors investigated multiple stacked crucibles that are airtight to an extent that does not prevent the reaction of the powder and scavenger, even as the product of the reaction is being generated in each stacked crucible and the excess scavenger is removed. It was experimentally found that it is effective to fasten each stacked crucible by screwing them into each other. In addition, where each stacked crucible is fastened so that it is very airtight, the airtightness is adjusted by having a slit for each crucible.

Using the multiple stacked crucibles of the present invention, fusion is carried out with the fusing method as described above. In order to uniformly carry out the reaction, the heat balance is monitored so that the difference in temperature between the upper crucible and lower crucible is 80° C. or less. Thus, the preprocessed product in each crucible has an approximately equally high quality, and is highly homogeneous.

The shape of the preprocessing crucibles, and in particular the shape of the bottom of the growth crucible, is such that the filling rate of the growth crucible is high. For the multiple stacked crucibles, the bottom shelf matches the shape of the bottom of the growth crucible.

For example, the multiple crucibles may have an opening on their top and are stacked in the vertical direction along the same axis. A crucible that is stacked on a lower stacked crucible has its bottom portion screwed to the top edge of the opening of the lower stacked crucible. The top stacked crucible has a lid that is screwed into the top edge of its opening, and the bottom stacked crucible is cone shaped so that it has the same shape as the growth crucible.

However, when the temperature is increased to the melting point, the preprocessed product thermally expands in the growth crucible, and the growth crucible risks damage. Therefore, the internal capacity of the preprocessing crucible should be smaller than the growth crucible, preferably approximately 90%.

As with the growth crucible, the material for the preprocessing crucible is not restricted to graphite, as long as it does not react with calcium fluoride and has a low wetability. Boron nitride may be used, and the number of stacked crucibles is selected based on the necessary volume.

As described above, when the preprocessed product is manufactured using the multiple stacked crucibles of the present invention, it is not necessary to mix large amounts of calcium fluoride powder and a scavenger at one time, because sufficient mixing can be conducted in small amounts. Consequently, for each stack, preprocessed products with high quality, high homogeneity and without localized reactions can be obtained. In addition, each preprocessed product is light and manageable. By filling these in the growth crucible, the filling efficiency of the material is significantly increased, and therefore, it is possible to manufacture a single crystal of calcium fluoride having a large diameter and height.

Next, the crystal growth process is discussed.

The material which passed through the degassing and the preprocess is filled in a growth crucible, which is placed in a growth furnace, and the growth furnace is maintained at a vacuum of $10^{-3}$ to $10^{-5}$ Pa. Next, the temperature inside the growth furnace is gradually increased, and after the material and any remaining scavenger have reacted, the temperature is gradually further increased to the melting point of calcium fluoride or higher (1370° C. to 1450° C.). Then, excess scavenger and the reaction product are vaporized, and the material is fused. In the crystal growth stage, by lowering the growth crucible at a rate of 0.1 to 5 mm/hr, a single crystal of calcium fluoride is obtained by gradually crystallizing it from the bottom of the crucible.

Degassing Process—Embodiment

As shown in FIG. 1, a crucible 1 made of graphite was covered with a lid 2 made of porous graphite. The internal diameter of the crucible 1 was selected to be 300 mm, after taking the manageability of the material filling operation and the manufacturing of the preprocessed product into account.

8 to 10 kg of a mixed material of highly pure calcium fluoride powder and a 1.0 mol % of scavenger ($PbF_2$) powder was filled into one of the degassing crucibles and covered with the lid 2, and was then placed in a degassing furnace. The number of shelves 3 inside the furnace was set to a maximum of 3, by taking the size of the crucibles, the amount necessary for the manufacturing of the preprocessed product and the load on the shelves 3 into account.

First, in order for the inside of the furnace to have a deoxygenated atmosphere, it was subjected to a vacuum of $10^{-3}$ to $10^{-5}$ Pa. Then, while a vacuum of $10^{-3}$ Pa or better was maintained, the temperature inside the furnace was gradually increased. A maintenance temperature of 800° C. was maintained for 10 hours and the adsorbed gas on the surface of the particles of the powder was desorbed. After the degassing was completed, the temperature inside the furnace was gradually lowered, and the powder, with the adsorbed gas that was on the surface of the particles now desorbed, was obtained. 1.5 days was required for the entire process for a crucible with a 10 kg filling capacity used in this batch, and 3 days for three crucibles used as a single batch.

A gas detection analysis of the obtained powder was carried out using a TG-MS (Thermogravimetric analyzer) by raising the temperature to 1500° C. in an inert gas atmosphere. No gas or other impurities, such as carbon compounds, were detected.

Degassing Process—Comparative Example

A comparative analysis of the gas content of two varieties of high purity calcium fluoride powder particles obtained under different manufacturing conditions (such as different synthesis processes and drying temperatures) was conducted using a TG-MS. The gas impurities that were detected are shown in Table 1.

TABLE 1

Gas Impurities Detected in the Calcium fluoride Powder

| Type of Gas Impurities | Embodiment (degassing) | Comparative Example 1 (No degassing) | Comparative Example 2 (No degassing) |
| --- | --- | --- | --- |
| $H_2O$ | Not detected | Detected | Not detected |
| $O_2$ | Not detected | Detected | Detected |
| CO | Not detected | Detected | Detected |
| $CO_2$ | Not detected | Detected | Detected |

Preprocess—Embodiment

Figure 2:
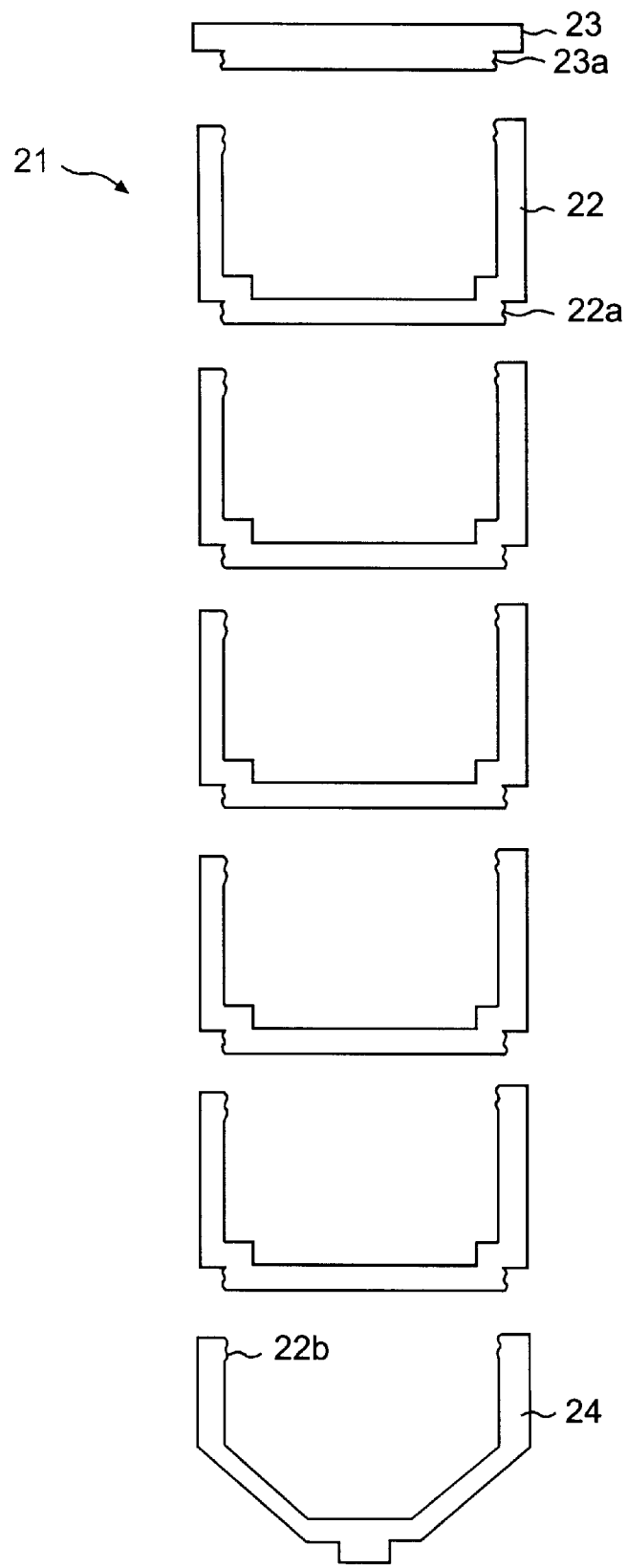

FIG. 2 shows an embodiment of multiple stacked crucibles made of graphite used for the preprocess. Multiple preprocess crucibles are stacked to form the arrangement 21. The preprocess crucibles are shaped such that the multiple graphite crucibles 22 with their top open are stacked in the vertical direction. On the bottom of each crucible 22 there is a projection 22a, 20 and by having the projection 22a screw into the top edge of opening 22b and stacking up the crucibles 22, a total of 6 stacked crucibles are arranged. On the topmost crucible, a lid 23, which has a projection 23a on the lower side, is screwed on. The internal bottom portion of the bottom-most crucible 24 is created in advance with a shape that has the same angle as the cone shape of the bottom of the growth crucible. In addition, by taking the manageability of filling the crucibles 22 and the thermal expansion of the preprocessed product into account, the internal diameter of each crucible 22 is set to 280 mm, which is 20 mm smaller than the internal diameter of the growth crucible (not shown).

Next, the degassed material obtained as in Embodiment 1 is filled into the multiple stacked crucibles 21 and the preprocessed product is manufactured.

A mixed material of 8 to 10 kg of highly pure calcium fluoride powder and a 1.0 mol % of scavenger ($PbF_2$) is placed in each crucible; the crucibles are stacked; and a lid 2 is placed on the top. The multiple stacked crucibles 21 are arranged on a supporting platform, and placed in an electric furnace. In order for each crucible 22 to have the same temperature, the electric furnace has the graphite heaters 4 including a plurality of heating elements arranged along the direction of the vertical axis in a multiple step configuration to increase the thermal length.

The preprocess was carried out as follows:

After the inside of the electric furnace was exhausted to a vacuum of $10^{-3}$ to $10^{-5}$ Pa, the temperature of the furnace was gradually increased and then maintained at the reaction temperature of the material and scavenger, that is, 800° C. to 900° C. for 8 hours. The temperature was gradually further increased to the melting point of the powder or higher, that is, 1370° C. to 1450° C., and the excess scavenger and reaction product were vaporized, and the powder was fused for 8 hours. When the fusing temperature is too high, not only does the vaporization of the powder becomes excessive, but also the calcium fluoride is selectively vaporized. Therefore, caution is required. Fusion was effected by controlling a graphite heater through thermocouple monitoring so that the difference between the temperature of the top stack and the bottom stack was 80° C. or less. Next, the temperature was lowered gradually, the fused material was solidified and the preprocessed product which is to be used for the growth of a single crystal of calcium fluoride was obtained.

The obtained preprocessed product was transparent and without any foreign objects or imperfections, such as bubbles. There was no segregation visible, and it was highly homogeneous. When the remaining lead density was analyzed with an ICP-AES spectrometer (manufactured by Varian), the results showed that throughout the product had a high quality of 20 ppm or less impurity content, which is the limit of detection. In addition, there were no differences due to the location of the crucibles.

It was found that by using a degassed powder for the manufacturing of the preprocessed product, it is possible to prevent the inside of the preprocess furnace from becoming contaminated.

Preprocess—Comparative Example

A highly pure mixed material of calcium fluoride powder which had not been degassed and 1.0 mol % of scavenger ($PbF_2$) was filled in preprocessing crucibles and preprocessed product was manufactured with the preprocessing furnace. It took 3 days in the case of 10 kg and 6 days in the case of 30 kg for the heating process of the initial manufacturing stage only, and therefore, it was found to have low productivity in comparison to the process that included degassing, which took less than one day.

Crystal Growth Process

By using the preprocessed product obtained through the preprocessing as above, a single crystal of calcium fluoride was grown.

Six obtained samples of the preprocessed product were filled directly into the growth crucible, and were placed in a growth furnace. The inside of the growth furnace was maintained at a vacuum of $10^{-3}$ to $10^{-5}$ Pa. The temperature was gradually raised to the melting point of calcium fluoride or higher, that is, 1370° C. to 1450° C., and the preprocessed product was fused. Then, by lowering the growth crucible at a speed of 0.1 to 5 mm/hour, a crystal of calcium fluoride was grown by crystallizing the material gradually from the bottom side of the crucible.

The obtained single crystal of calcium fluoride had few impurities, and, due to its small change in mass, was a single calcium fluoride crystal with high purity and was of a size that was equivalent to the filled preprocessed product.

In addition, a reaction product was not generated during the fusion and therefore, the inside of the growth furnace was not contaminated. The thermostat functioned normally, and the life of the replaceable components of the furnace was prolonged.

With the present invention, by conducting a desorption process for the adsorbed gas as a pre-stage of both a preprocess product manufacturing and single crystal manufacturing, it is possible to obtain a highly pure calcium fluoride powder. In addition, during the degassing, a porous lid is used to improve the exhausting efficiency, and, as a result, there is a reduction in processing time. Furthermore, the degassing of the powder is conducted with a dedicated processing furnace, and consequently the single crystal manufacturing furnace or preprocessing furnace does not become contaminated. By separating the degassing from the single crystal manufacturing furnace and preprocessing furnace, it is possible to improve the production efficiency.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A manufacturing method for a single crystal of calcium fluoride comprising the steps of:

degassing calcium fluoride powder particles to desorb impurities from surfaces of the calcium fluoride powder particles;

preprocessing the degassed calcium fluoride powder particles by fusing the degassed calcium fluoride powder particles in a crucible to obtain a preprocessed product; and re-fusing the preprocessed product in a crucible to grow a single crystal of calcium fluoride.

2. The manufacturing method of claim 1, wherein the degassing step uses a calcium fluoride powder that includes a scavenger.

3. The method of claim 1, wherein the degassing step is conducted using a crucible with a porous lid.

4. The method of claim 1, wherein the degassing step is conducted by stacking multiple crucibles on shelves that are vertically aligned.

5. The method of claim 1, wherein the preprocessing step is conducted by vertically stacking multiple crucibles.

6. A manufacturing method for a single crystal of calcium fluoride comprising the steps of:

degassing calcium fluoride powder particles wherein adsorbed gas on surfaces of the calcium fluoride powder particles is desorbed by heating the powder in a crucible for a maintenance period in a vacuumed furnace;

preprocessing the degassed calcium fluoride powder particles by conducting a deoxygenation reaction in a vacuumed furnace, the preprocessing step being conducted at a temperature that is approximately the melting point of calcium fluoride or higher to obtain a preprocessed product;

crystallizing the resultant preprocessed product by filling the preprocessed product into a crucible, followed by fusing the preprocessed product at the melting point of calcium fluoride or higher; and lowering the crucible and thereby crystallizing the preprocessed product from a bottom of the crucible.

7. The method of claim 6, wherein the degassing step uses a calcium fluoride powder that includes a scavenger.

8. The method of claim 6, wherein the degassing step is conducted using a crucible with a porous lid.

9. The method of claim 6, wherein the degassing step is conducted by stacking multiple crucibles onto shelves that are vertically aligned.

10. The method of claim 6, wherein the preprocessing step is conducted by vertically stacking multiple crucibles.

* * * * *